United States Patent
Sato et al.

(10) Patent No.: US 8,957,520 B2
(45) Date of Patent: Feb. 17, 2015

(54) MICROELECTRONIC ASSEMBLY COMPRISING DIELECTRIC STRUCTURES WITH DIFFERENT YOUNG MODULUS AND HAVING REDUCED MECHANICAL STRESSES BETWEEN THE DEVICE TERMINALS AND EXTERNAL CONTACTS

(75) Inventors: Hiroaki Sato, Yokohama (JP); Yukio Hashimoto, Hitachinaka (JP); Yoshikuni Nakadaira, Hodogaya-Ku (JP); Norihito Masuda, Yokohama (JP); Belgacem Haba, Saratoga, CA (US); Ilyas Mohammed, Santa Clara, CA (US); Philip Damberg, Cupertino, CA (US)

(73) Assignee: Tessera, Inc., San Jose, CA (US)

( * ) Notice: Subject to any disclaimer, the term of this patent is extended or adjusted under 35 U.S.C. 154(b) by 451 days.

(21) Appl. No.: 13/155,552

(22) Filed: Jun. 8, 2011

(65) Prior Publication Data
US 2012/0313238 A1  Dec. 13, 2012

(51) Int. Cl.
*H01L 23/52* (2006.01)
*H01L 23/48* (2006.01)
*H01L 29/40* (2006.01)
*H01L 21/56* (2006.01)
*H01L 23/498* (2006.01)
*H01L 21/48* (2006.01)
*H01L 23/31* (2006.01)

(52) U.S. Cl.
CPC ............ *H01L 21/561* (2013.01); *H01L 21/568* (2013.01); *H01L 23/49822* (2013.01); *H01L 21/4857* (2013.01); *H01L 23/3128* (2013.01); *H01L 2224/16225* (2013.01); *H01L 2224/32225* (2013.01); *H01L 2224/73204* (2013.01); *H01L 23/49811* (2013.01)

USPC .......... 257/758; 257/700; 257/750; 257/774; 257/E23.062

(58) Field of Classification Search
CPC ............ H01L 2224/97; H01L 23/5329; H01L 23/53295; H01L 23/49822; H01L 21/76835; H01L 23/49816
USPC .......... 257/698, 700, 758, E23.062, E23.167, 257/E23.142, 737, 750, 774–776
See application file for complete search history.

(56) References Cited

U.S. PATENT DOCUMENTS

| 5,455,390 | A | 10/1995 | DiStefano et al. |
| 5,483,421 | A * | 1/1996 | Gedney et al. ................. 361/771 |
| 2004/0034187 | A1 * | 2/2004 | Arai et al. ........................ 528/87 |
| 2011/0121445 | A1 * | 5/2011 | Mori et al. ..................... 257/693 |

* cited by examiner

Primary Examiner — Marcos D. Pizarro
Assistant Examiner — Cesar Lopez
(74) Attorney, Agent, or Firm — Lerner, David, Littenberg, Krumholz & Mentlik, LLP

(57) ABSTRACT

A microelectronic assembly may include a substrate containing a dielectric element having first and second opposed surfaces. The dielectric element may include a first dielectric layer adjacent the first surface, and a second dielectric layer disposed between the first dielectric layer and the second surface. A Young's modulus of the first dielectric layer may be at least 50% greater than the Young's modulus of the second dielectric layer, which is less than two gigapascal (GPa). A conductive structure may extend through the first and second dielectric layers and electrically connect substrate contacts at the first surface with terminals at the second surface. The substrate contacts may be joined with contacts of a microelectronic element through conductive masses, and a rigid underfill may be between the microelectronic element and the first surface. The terminals may be usable to bond the microelectronic assembly to contacts of a component external to the microelectronic assembly.

40 Claims, 9 Drawing Sheets

MICROELECTRONIC ASSEMBLY COMPRISING DIELECTRIC STRUCTURES WITH DIFFERENT YOUNG MODULUS AND HAVING REDUCED MECHANICAL STRESSES BETWEEN THE DEVICE TERMINALS AND EXTERNAL CONTACTS

BACKGROUND

The subject matter shown and described in the present application relates to assemblies in which semiconductor chips are packaged and to methods and components useful in making such assemblies.

Modern electronic devices utilize semiconductor chips, commonly referred to as "integrated circuits" which incorporate numerous electronic elements, such as transistors or other active circuit elements. These chips are mounted on substrates which physically support the chips and electrically interconnect each chip with other elements of the circuit. For example, the chip may be mounted in a face-down arrangement, so that a front surface of the chip having contacts thereon confronts a top surface of the substrate and a rear surface of the chip faces upwardly, away from the top surface of the substrate.

The substrate may be a part of a discrete chip package or microelectronic assembly used to hold a single chip and equipped with terminals for interconnection to external circuit elements. Such substrates may be secured to an external circuit board or chassis. Alternatively, in a so-called "hybrid circuit" one or more chips are mounted directly to a substrate forming a circuit panel arranged to interconnect the chips and the other circuit elements mounted to the substrate. In either case, the chip must be securely held on the substrate and must be provided with reliable electrical interconnection to the substrate.

In a microelectronic assembly, structures electrically interconnecting a chip to a substrate ordinarily are subject to substantial strain caused by thermal excursions or cycling between low and high temperatures as temperatures within the device change, such as may occur during fabrication, operation or testing of the device. For example, during operation, the electrical power dissipated within the chip tends to heat the chip and substrate, so that the temperatures of the chip and substrate rise each time the device is turned on and fall each time the device is turned off. As the chip and the substrate ordinarily are formed from different materials having different coefficients of thermal expansion, the chip and substrate ordinarily expand and contract by different amounts. This may cause electrical contacts on the chip to move relative to electrical contacts, such as pads, on the substrate and to terminals on a rear surface of the substrate that connect the substrate to another element, such as another microelectronic element, as the temperature of the chip and the substrate changes. This relative movement can deform electrical interconnections between the chip and substrate, and the another microelectronic element and substrate, and place them under mechanical stress. These stresses are applied repeatedly with repeated operation of the device, and can cause breakage of the electrical interconnections, which in turn reduces reliability performance of the device. Thermal cycling stresses may occur even where the chip and substrate are formed from like materials having similar coefficients of thermal expansion, because the temperature of the chip may increase more rapidly than the temperature of the substrate when power is first applied to the chip.

Improvements can be made to structures that provide for electrical interconnection of a chip to a substrate of a microelectronic assembly and the processes used to fabricate such structures.

SUMMARY

In accordance with an embodiment, a microelectronic assembly may include a substrate including a dielectric element having first and second opposed surfaces. The dielectric element may include a first dielectric layer having a first material structure adjacent the first surface, and a second dielectric layer having a second material structure different from the first material structure. The second dielectric layer may be disposed between the first dielectric layer and the second surface, and have a Young's modulus less than two gigapascal (GPa). A Young's modulus of the first dielectric layer may be at least 50% greater than the Young's modulus of the second dielectric layer. The substrate may further include a plurality of substrate contacts at the first surface, a plurality of terminals at the second surface, and a conductive structure extending through the first and second dielectric layers and electrically connecting the substrate contacts with the terminals. The assembly may further include a microelectronic element having a face confronting the first surface and a plurality of element contacts thereon joined with the substrate contacts through conductive masses. A rigid underfill may be between the face of the microelectronic element and the first surface. The terminals may be usable for bonding the microelectronic assembly to corresponding contacts of a component external to the microelectronic assembly.

In accordance with another embodiment, an interconnection substrate may include a dielectric element having first and second opposed surfaces, a first dielectric layer having a first material structure adjacent the first surface and a second dielectric layer having a second material structure different from the first material structure. The second dielectric layer may be disposed between the first dielectric layer and the second surface, and have a Young's modulus less than two gigapascal (GPa). A Young's modulus of the first dielectric layer may be at least 50% greater than the Young's modulus of the second dielectric layer. The substrate may include a plurality of substrate contacts at the first surface for joining with element contacts exposed at a face of microelectronic element confronting the first surface, and at least a portion of the substrate contacts may match a pattern of the element contacts exposed at the face of the microelectronic element. The substrate further may include a plurality of terminals at the second surface for joining with respective contacts of a component external to the substrate; and a conductive structure extending through the first and second dielectric layers and electrically connecting the substrate contacts to the terminals.

In another embodiment, a microelectronic assembly may include a substrate including a dielectric element having first and second opposed surfaces. The dielectric element may include a first dielectric layer having a first material structure adjacent the first surface, and a second dielectric layer having a second material structure different from the first material structure. The second dielectric layer may be disposed between the first dielectric layer and the second surface, and have a Young's modulus less than two gigapascal (GPa). A Young's modulus of the first dielectric layer may be at least 50% greater than the Young's modulus of the second dielectric layer. The substrate may further include a plurality of substrate contacts at the first surface, a plurality of terminals at the second surface, and a conductive structure extending through the first and second dielectric layers and electrically connecting the substrate contacts with the terminals. The assembly may also include a microelectronic element having a face confronting the first surface and a plurality of element contacts thereon joined with the substrate contacts through conductive masses, and a rigid underfill between the face of the microelectronic element and the first surface. The terminals may be usable for bonding the microelectronic assembly to corresponding contacts of a component external to the microelectronic assembly such that the terminals are movable with respect to the substrate contacts.

In accordance with another embodiment, a method of fabricating a microelectronic assembly may include joining element contacts at a face of a microelectronic element with a plurality of substrate contacts at a first surface of a dielectric element of a substrate confronting the face through conductive masses. The dielectric element may have a conductive element at a second surface opposed to the first surface, a first dielectric layer having a first material structure adjacent the first surface and a second dielectric layer having a second material structure different from the first material structure. The second dielectric layer may be disposed between the first dielectric layer and the second surface, and have a Young's modulus less than two gigapascal (GPa). A Young's modulus of the first dielectric layer may be at least 50% greater than the Young's modulus of the second dielectric layer, and the substrate may include a conductive structure extending through the first and second dielectric layers. The method may further include forming a rigid underfill between the face of the microelectronic element and the first surface of the dielectric element, and patterning the conductive element after the joining step to form terminals at the second surface of the dielectric element, where the substrate contacts are electrically connected with the terminals through the conductive structure, and the terminals are usable to electrically connect the microelectronic assembly to a component external to the microelectronic assembly.

DETAILED DESCRIPTION

Figure 1:
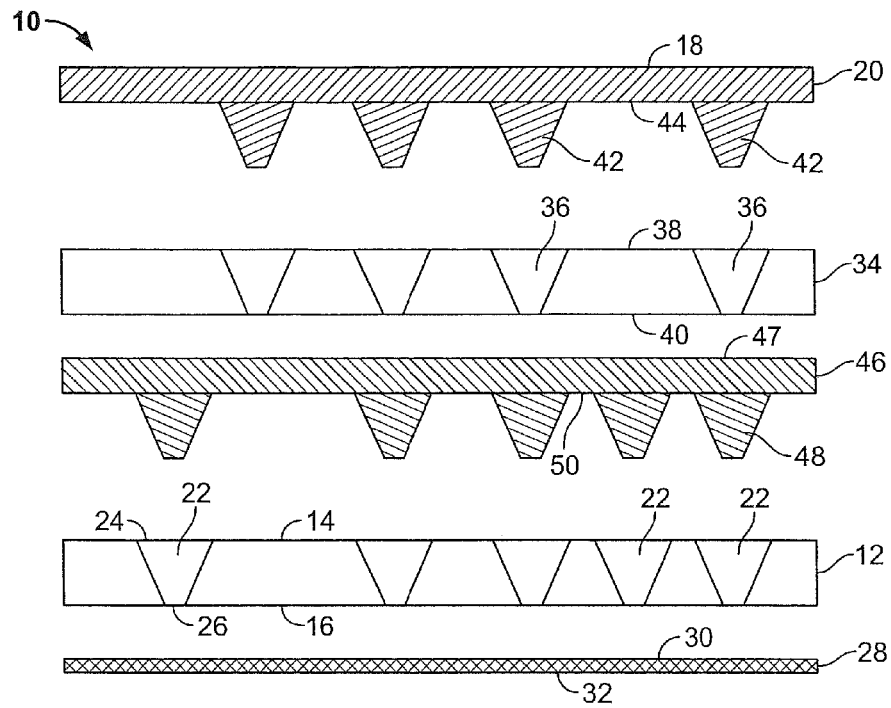
FIGS. 1-4 are diagrammatic sectional views illustrating stages in a method of fabricating a substrate, in accordance with one embodiment of the invention.

A substrate 10 fabricated, in accordance with an embodiment of the present invention, for mounting a microelectronic element, such as a semiconductor chip, thereto may include a compliant dielectric layer 12 having a surface 14 facing upwardly and a surface 16 facing downwardly, as shown in FIG. 1.

Figure 2:
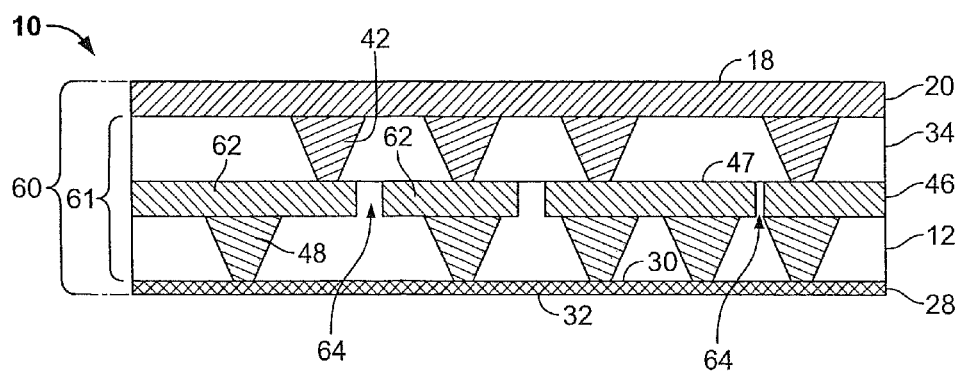

As used in this disclosure, terms such as "upwardly," "downwardly," "vertically" and "horizontally" should be understood as referring to the frame of reference of the element specified and need not conform to the normal gravitational frame of reference. Also, for ease of reference, directions are stated in this disclosure with reference to a "top" or "front" surface of a substrate, such as a top surface 18 of an inner conductive layer 20 of the substrate 10 as shown in FIG. 2. Generally, directions referred to as "upward" or "rising from" shall refer to the direction orthogonal and away from the front surface of the substrate. Directions referred to as "downward" shall refer to the directions orthogonal to the front surface of the substrate and opposite the upward direction. A "vertical" direction shall refer to a direction orthogonal to a front surface of the substrate. The term "above" a reference point shall refer to a point upward of the reference point, and the term "below" a reference point shall refer to a point downward of the reference point. The "top" of any individual element shall refer to the point or points of that element which extend furthest in the upward direction, and the term "bottom" of any element shall refer to the point or points of that element which extend furthest in the downward direction.

The compliant dielectric layer 12 may have a Young's modulus of less than about 2 gigapascal (GPa) and have a material structure formed from materials having a density or hardness of a material used as a filler in compositions such as flexibilized epoxy, silicone, a low modulus epoxy, a TEFLON based material, a foam type material, a liquid-crystal polymer, a thermoset polymer, a fluoropolymer, a thermoplastic polymer, polyimide, polytetrafluoroethylene (PTFE), perfluoroalkoxy (PFA), fluorinated ethylene propylene (FEP) and polyfluoroethylene (PTFE) or like compositions. In a particular embodiment, the compliant dielectric layer may have elastic properties comparable to those of soft rubber and have about 20 to 70 Shore A durometer hardness. The compliant dielectric layer may be a solid, uniform layer and have a thickness between the surfaces 14 and 16 of about 15-20 microns.

In addition, the compliant dielectric layer 12 has holes 22 formed therein extending between the surfaces 14 and 16. The holes 22 may be substantially cone-shaped or cylindrically-shaped having substantially circularly-shaped top ends 24 at the surface and substantially circularly-shaped bottom ends 26 at the surface 16. The holes 22 may have an average diameter or width of about 25-50 microns. The difference between the diameter or width of the top ends 24 of the holes 22 and the diameter or width of the bottom ends 26 may be about 5-10 microns. In some examples, the width of the bottom end of a hole can be smaller than the width at the top end; in another example, the bottom end width of the hole can be the same as the top end width.

The substrate 10 also may include a planar conductive layer 28 formed from an etchable conductive material, which is desirably a metal, such as copper, a copper-based alloy, aluminum, nickel and gold. The conductive layer 28 most typically is about 12-300 μm thick between top surface 30 and bottom surface 32.

The substrate 10 may further include a rigid layer 34. The rigid layer 34 may include holes 36 extending between a top surface 38 and a bottom surface 40. In one embodiment, the holes 36 may be in a pattern that at least partially corresponds to the pattern of the holes 22 formed in the compliant dielectric layer 12. The rigid layer 34 may have a Young's modulus that is at least 50% greater than the Young's modulus of the compliant dielectric layer 12. As discussed in further detail below, a substrate of a microelectronic assembly containing a dielectric element 61 including the layers 12 and 34 may reduce mechanical stress between microelectronic elements, which are electrically connected to substrate contacts at a top surface of the substrate, and terminals at a bottom surface of the substrate which are electrically connected to contacts of a microelectronic component external to the microelectronic assembly.

In one embodiment, the rigid layer 34 may have a Young's modulus of at least about 2 GPa, and most desirably about 6-10 GPa, and have a material structure formed from materials having a density or hardness of a material used as a filler in compositions such as filled epoxy, epoxy glass, epoxy glass composite, glass woven material, ceramic or like materials. The rigid layer 34, hence, has a material structure different from the material structure of the compliant dielectric layer, the difference in the material structure being based on the difference between the density or hardness of a material used as a filler in the rigid layer and the density or hardness of a material used as a filler in the compliant dielectric layer.

The inner conductive layer 20 of the substrate 10 may include projections 42 extending from a bottom surface 44 of the layer 20. The projections 42 are disposed in a pattern corresponding to the pattern of the holes 36 in the rigid layer 34. The layer 20 may be formed from a metal, such as used to form the layer 28, and most typically is about 5-20 μm thick between the top and bottom surfaces. In one embodiment, the layer 20 with the projections 42 may be a unitary structure, with the projections formed integrally with the layer 20.

Further, the substrate 10 may include a conductive layer 46 having projections 48 extending from a bottom surface 50 of the layer 46. The projections 48 are disposed in a pattern corresponding to the pattern of the holes 22 in the compliant dielectric layer 12. The layer 46 may be formed from a metal, such as used to form the layers 20 and 28, and most typically is about 5-20 μm thick between the top and bottom surfaces. In one embodiment, the layer 46 with the projections 48 may be a unitary structure, with the projections formed integrally with the layer 46.

In one stage of fabrication of the substrate, the conductive layers 20, 28 and 46 may be laminated, individually or simultaneously, to the compliant dielectric layer 12 and the rigid layer 34 to form an in-process structure 60, as shown in FIG. 2. In the structure 60, the rigid layer 34 and the compliant dielectric layer 12, in combination, form the dielectric element 61. As discussed herein, the dielectric element 61 may reduce mechanical stress in electrical connections between contacts of a microelectronic assembly, which includes a substrate containing the dielectric element and where the contacts are adjacent the rigid layer 34 of the dielectric element, and a component attached at terminals of the assembly, where the terminals and the contacts are electrically connected by a conductive structure extending through the rigid layer 34 and the compliant dielectric layer 12 of the dielectric element 61.

It is to be understood that the terms "compliant" for designating the layer 12 and "rigid" for designating the layer 34 are used for convenience to describe the layers 12 and 34. In embodiments of the present invention, the substrate may include a dielectric element having a first dielectric layer, such as the layer 34, which is adjacent a first surface of the dielectric element at which microelectronic element contacts are to be joined and has a Young's modulus at least 50% greater than a second dielectric layer, such as the layer 12, which is between the first dielectric layer and a second surface of the dielectric element opposed to the first surface. In some embodiments, each of the first and second dielectric layers of the dielectric element may have a Young's modulus less than about 2 GPa. In other embodiments, all dielectric layers of the substrate, including each of the first and second dielectric layers and any additional dielectric layer of the dielectric element, may have a Young's modulus less than about 2 GPa.

Referring to FIG. 2, in the structure 60, the conductive layers 20 and 28 are electrically connected with each other through the projections 42 and 48 and conductive traces 62 of the conductive layer 46. The projections 42 and 48 act as conductive vias extending, respectively, through the holes 36 of the conductive layer 34 and the holes 22 of the compliant dielectric layer 12, and electrically connecting the conductive layers 20 and with each other through an electrical connection with the conductive traces 62. The conductive vias 42 and 48 desirably fill the entirety of the holes 36 and 22, respectively, so as to have the same structure as the holes. The conductive vias 42 and 48 also may extend from the conductive traces 62.

As will be seen in the various embodiments provided herein, the dielectric element may include one or more layers of rigid dielectric material and have conductive vias extending through a thickness of the one or more rigid layers, and one or more layers of compliant dielectric material and have conductive vias extending through a thickness of the one or more compliant dielectric layers, where substrate contacts are at a surface of a rigid layer of the dielectric element.

In one embodiment, a lamination process may be performed so that the conductive vias 48 extend from the layer 46, through the holes 22 and abut the inner surface 30 of the conductive layer 28. To assure abutting contact, the height of the projections 48 prior to lamination may be slightly greater than the thickness of the layer 12, and the layer 12 and layer 28 are squeezed together so that the projections 48 are slightly flattened by engagement with the layer 28. In addition, a similar lamination process may be performed so that the conductive vias 42 extend from the layer 20, through the holes 36 of the rigid layer 34 and abut inner surface 47 of the conductive layer 46.

In a further embodiment, the abutting surfaces of the projections 48 and the layer 12, and the projections 42 and the layer 34, respectively, are bonded to each other. The bonding of the projections to the corresponding layer may be performed, for example, as disclosed in U.S. Pat. No. 7,495,179, incorporated by reference herein.

In addition, in the in-process structure 60, the inner conductive layer 20 adheres to the upper surface 38 of the rigid layer 34, the conductive layer 46 adheres to the bottom surface of the rigid layer 34 or the top surface 14 of the compliant dielectric layer 12, and the conductive layer 28 adheres to the surface 16 of the compliant dielectric layer 12, based on plating of the layer 20 on the layer 34, plating of the layer 28 on the layer 12 and plating of the layer 46 on the layer 34 or the layer 12.

Alternatively, a compliant dielectric layer may be provided in a partially-cured state and further cured in contact with the layer 28 and/or the layer 46 during the lamination process. In addition, a layer of rigid dielectric material may be provided in a partially-cured state and further cured in contact with the layer 20 and/or the layer 46 during the lamination process.

Although the individual layers are depicted separately in FIG. 1, a compliant dielectric layer may be carried into the lamination process on the layer 28 or the layer 46. For example, the compliant dielectric layer may be provided with the holes 22, such as by ablating, punching or etching a continuous dielectric layer to form the holes, and then laminated to the conductive layer 28 and/or the conductive layer 46. Alternatively, the compliant dielectric layer 12 may be formed on either of the conductive layers 28, 46, such as by coating the conductive layer with a liquid precursor and then curing the precursor to form the dielectric layer 12. In an embodiment where the compliant dielectric layer 12 includes photosensitive material, such as a photosensitive material of the type commonly used as a solder mask on electronic components, the holes 22 may be formed by photolithographically patterning the layer 12. In a further embodiment, a completely or partially cured solid compliant dielectric layer without pre-formed holes may be forcibly engaged with the conductive layer 46 bearing projections so that the projections penetrate through the compliant dielectric layer. The projections may be formed with sharp points or sharp edges to facilitate this process.

In addition, a rigid dielectric layer may be carried into the lamination process on the layer 20 or the layer 46, and have the holes 36 provided similarly as discussed for the compliant dielectric layer, and then laminated to the conductive layer 20 and/or the conductive layer 46. Alternatively, the rigid layer 34 may be formed on either of the conductive layers 20, 46, such as by coating the conductive layer with a liquid precursor and then curing the precursor to form the rigid layer 34. The rigid layer 34 also may include photosensitive material, which may be provided therein similarly as described for the layer 12. Also, a completely or partially cured solid rigid layer without pre-formed holes may be forcibly engaged with the conductive layer 20 bearing projections 42 similarly as discussed for the layer 46 and the layer 12.

In a further embodiment, fabrication may be performed to laminate the conductive layer 46 to the layer 12, so that projections 64 of dielectric material of the compliant dielectric layer 12 extend from the surface 14 upwardly through openings between the conductive traces 62 of the layer 46.

Figure 3:
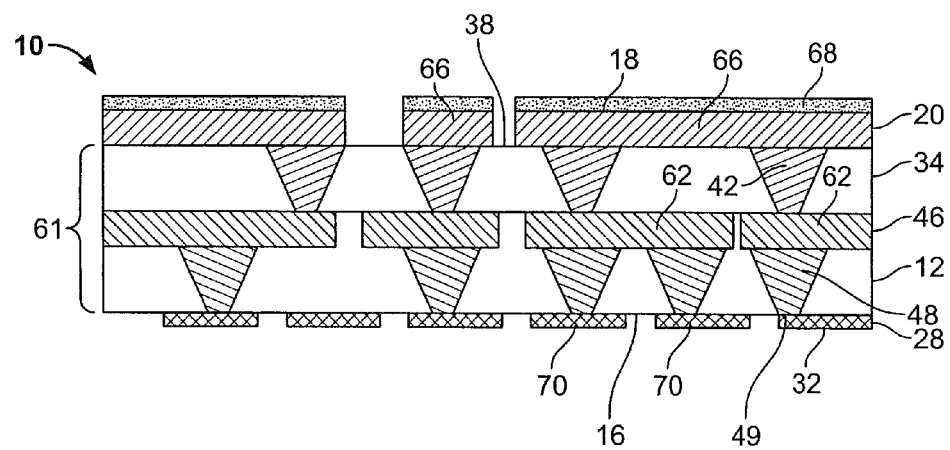

In a further stage of the process, the inner conductive layer 20 of the in-process structure 60 may be treated by patterning a photoresist or other etch-resistant material on the surface 18 of the layer 20 by conventional photolithographic patterning procedures, and then exposing exposed portions of the surface 18 of the layer 20 to an etchant which attacks the material of the layer 20. The etchant exposure is continued for a time sufficient to remove those portions of the layer 20 not covered by the photoresist. After removal of the portions of the layer 20, portions 66 of the layer 20 remain, as shown in FIG. 3. The etch-resistant material is removed from the portions 66, following the etching process. The remaining portions 66 of the inner conductive layer 20 may include contacts for electrical connection of the substrate 10 to a semiconductor chip, and traces extending along the surface 38 from such contacts to electrically connect the contacts with other conductive elements within or attached to the substrate, as described in detail below.

In a further embodiment, referring to FIG. 3, the substrate 10 may optionally include a protective layer 68 formed on the upper surfaces 18 of the conductive portions 66. The protective layer 68 may include a corrosion-resistant or oxidation-resistant metal, such as nickel or gold, or be formed from organic solderability preservative ("OSP") or a flux material. In one embodiment, the etch-resistant material used to form the portions 66 may also include a corrosion-resistant metal, such as nickel or gold, such that the material may be left in place as the layer 68 after formation of the portions 66.

In a further stage of the process, the conductive layer of the substrate 10 may be treated. In one embodiment, an etch-resistant material, such as a photoresist (not shown), may be applied on portions of outer surface 32 of the layer 28 that are not aligned with the conductive vias 48 exposed at the surface 16 of the compliant dielectric layer 12. The etch-resistant material may be applied to and maintained on the surfaces of the layer 28 to remove portions thereof, using similar techniques as described above, to obtain remaining conductive portions 70 of the layer 28. Some of the conductive portions 70 may be electrically connected with, and optionally extend from, bottom surfaces 49 of the conductive vias 48.

As used in this disclosure, an electrically conductive feature can be considered "exposed at" a surface of a dielectric layer if the metallic feature is accessible to a contact or bonding material applied to such surface. Thus, a metallic feature which projects from the surface of the dielectric or which is flush with the surface of the dielectric is exposed at such surface; whereas a recessed conductive feature disposed in or aligned with a hole in the dielectric extending to the surface of the dielectric is also exposed at such surface.

Referring to FIG. 3, conductive layer 20 extends along the surface 38 which is remote from the surface 16 of the layer 12 along which the conductive layer 28 extends, the conductive vias extending through the layer 12 electrically connect the portions 70 of the conductive layer 28 with the traces 62 and the conductive vias 42 extending through the rigid layer 46 electrically connect the portions 66 of the conductive layer 28 with the traces 62, such that the vias 42, 48, through the traces 62, electrically connect the portions 70 with the portions 66. The portions 70 may constitute terminals at a surface of the dielectric element 61 that may be electrically connected with a microelectronic element, such as a semiconductor chip, which is external to the substrate 10 and electrically connected to the substrate 10 at a surface of the dielectric element 61 remote from the surface of the element 61 at which the terminals are located. The substrate 10, as such, provides for electrical interconnection of the terminals at the bottom surface of the substrate with the contacts at the front surface of the substrate. The portions 70 may be electrically connected through the dielectric element 61, by being electrically connected through the conductive vias 48, 42 and the traces 62 of the element 61, with a microelectronic element electrically connected with the portions 66 of the conductive layer 20, as discussed in further detail below.

In one embodiment, referring to FIG. 3, after formation of the conductive portions 66, a solder resist layer (not shown) may be formed patterned on uncovered portions of the surface 16 of the compliant dielectric layer 12 and also on exposed portions of the portions 70. The solder resist layer may be formed from a photoimageable or other material and have a thickness of about 10-25 microns.

Figure 4:
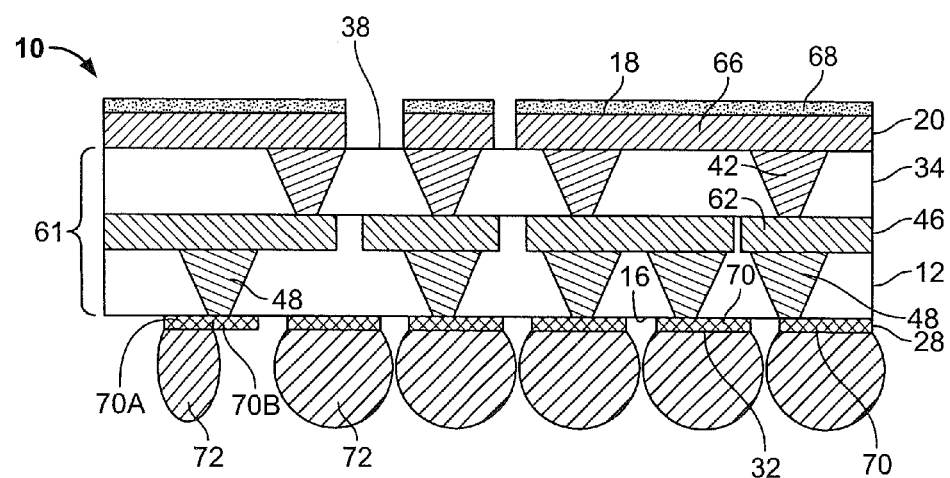

Referring to FIG. 4, masses 72 of electrically conductive material, such as solder, may be formed on exposed portions of the surface 32 of the conductive portions 70, following formation of the solder resist layer, and then the solder resist layer is removed. The masses 72 may be electrically interconnected with the conductive portions 66 through the conductive portions 70, which may include contacts that serve as the terminals of the substrate 10, the conductive vias 48, the traces 62 and the conductive vias 42. In one embodiment, the conductive portions 70 may include contacts 70A that serve as the terminals and traces 70B that extend from the contacts 70A along the surface 16 and electrically connect the terminals 70A with the conductive portions 66 through the vias 42, 48 and the traces 62. The traces 70B may partially overlie and be in contact with the conductive vias 48, such that the traces 70B electrically connect the terminals 70A with the vias 48. The masses 72 may include a bond metal such as solder, which may or may not be lead-free, or such as tin or indium.

It is to be understood that the order of steps used to make the substrate 10 can be varied from that discussed above. For example, although the steps of treating the conductive layer 20 and the conductive layer 28 have been described sequentially above for ease of understanding, these steps may be performed in any order or simultaneously. For example, the conductive layers and 28 may be etched simultaneously after application of photoresists. Also, the conductive layer 20 may be in the form of individual conductive features, such as portions that may be contacts and traces, when initially united with the rigid layer 34. For example, the conductive portions may be formed by selective deposition on the rigid layer 34 before or after treatment of the conductive layer 20. If the inner conductive layer 20 is formed by deposition on the inner surface 38 of the rigid layer 34 before treatment of the conductive layer 28, the projections 42 may be formed in the same deposition step.

In some embodiments, the conductive layers may be formed by sputtering or blanket metallization, and followed by surface patterning using photolithography. See U.S. Patent Publication No. 2008-0116544, filed Nov. 22, 2006, incorporated by reference herein. Alternatively, the conductive layers may be formed by electroless plating.

In a further variant, the projections 42 may be initially formed on the conductive layer 46 rather than on the inner conductive layer 20, and the projections 48 may be initially formed on the layer 28 rather than on the layer 46. In this case, the conductive layers 28 or 20 may be treated before or after application of the conductive layer 46 to the rigid layer 34 or the layer 12. Also, the step of forming holes in the compliant dielectric layer or the rigid layer may be performed before or after the other steps of the process. Also, the various steps may be, and most preferably are, conducted while one or more of the compliant dielectric layer 12 and the rigid layer 34 are part of a larger sheet or tape. Individual substrate components as depicted in FIG. 4 can be obtained by severing such a sheet or tape. Most typically, however, the substrate components are left in the form of a sheet or tape until after semiconductor chips or other devices are mounted to the substrate components.

In a further embodiment, dielectric material may be cast or molded around the projections 42, for example, by engaging the inner conductive layer 20, the projections 42 and the conductive layer 46 in a compression mold or injection mold, and injecting uncured dielectric material around the projections so as to form the rigid layer in place. In addition, similar fabrication steps may be formed to cast or mold a compliant dielectric layer around the projections 48 to form the compliant dielectric layer 12 in place.

Alternatively, dielectric material used to form the compliant dielectric layer or the rigid layer may be applied as a flowable material that may flow to form a layer surrounding projections from a conductive layer under the influence of gravity or under the influence of centrifugal force applied in a centrifuge or similar device.

In one embodiment, the substrate may be formed with a layer of solder resist on the surface 38 of the rigid layer 34.

A microelectronic assembly 100 (FIG. 5) made using the substrate 10 of FIG. 4 may incorporate a microelectronic element 102, such as a semiconductor chip, having a generally planar front face 104, a generally planar rear face 107 and contacts (not shown) exposed at the front face 104. The substrate 10 and the chip 102 may be assembled with the chip 102 mounted on the substrate 10 in a front-face-down orientation, with the front face 104 of the chip facing the top surface 18 of the conductive portions 66. The contacts on the chip 102 may be electrically connected to internal electronic components (not shown) of the chip 102.

In addition, the contacts on the surface 104 of the chip may be aligned and bonded with conductive material of the substrate, such as contacts 66A of the conductive portions 66, or a contact (not shown) on the optional layer 68, by masses 106 of electrically conductive material. The masses 106 may include a bond metal such as solder, which may or may not be lead-free, or such as tin or indium.

Traces 66B of the conductive portions 66 extend along the surface 38 of the rigid layer 34 away from the contacts 66A and electrically connect the contacts 66A with the conductive vias 42, which extend downwardly from the traces 66B. The traces 66B may partially overlie and be in contact with the conductive vias 42, such that the traces 66B electrically connect the contacts 66A with the vias 42. The vias 42 are electrically connected with the vias 48 through the traces 62, from which the vias 42 and 48 may extend. The conductive portions 70, thus, may be electrically connected with the contacts 66A, which are joined to the contacts on the chip 102 by the masses 106, by a conductive structure including the conductive vias 42 and 48 and the traces 62. The conductive portions 70, which are electrically connected with the vias 48, serve as terminals that may provide for electrical connection of the vias 42, through the traces 62 and the vias 48, with contacts (not shown) of an external microelectronic element 150, through the solder masses 72 formed on the outer surfaces 32 of the portions 70.

Figure 5:
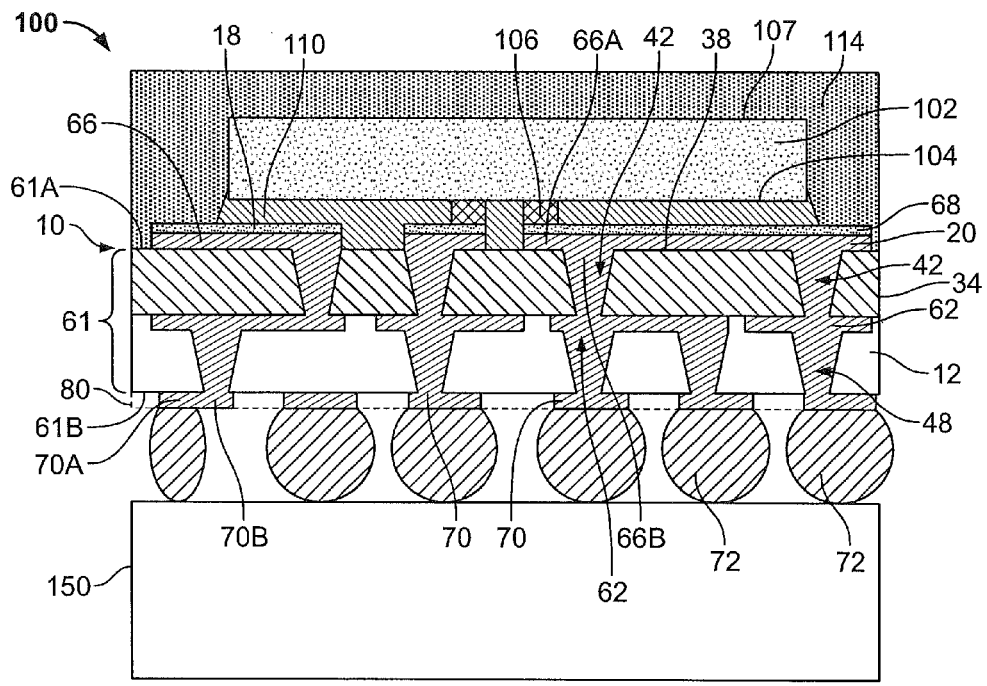
FIG. 5 is a diagrammatic sectional view of a microelectronic assembly formed using the substrate of the method of FIGS. 1-4, in accordance with one embodiment of the invention.

In one embodiment, referring to FIG. 5, a conductive structure electrically connecting terminals with substrate contacts may include conductive traces, such as the traces 66B, extending along and parallel to a front surface 61A of the dielectric element 61, such as the surface 36 of the rigid layer 34; conductive traces, such as the traces 70B, extending along and parallel to a bottom surface 61B of the dielectric element 61, such as the surface 16 of the compliant dielectric layer 12; and conductive traces which are between the surfaces 61A and 61B and, in one example, extend along a boundary between the layers 12 and 34, such as the traces 62 between the layers 12 and 34.

In one embodiment, a microelectronic package may be formed by using the terminals 70 to bond the assembly 100 to corresponding contacts of the external microelectronic element 150, which may be a circuit panel included in electronic devices such as a smart phone, mobile phone, personal digital assistant (PDA) and the like, with bonding material, such as solder, between the terminals and the circuit panel that joins the assembly 100 with the circuit panel. In a further embodiment, the bonding material may be the solder masses 72 of the assembly 100. Alternatively, the solder masses 72 may be omitted from the assembly 100, and bonding material, such as solder, may be applied at the terminals 70 when the assembly 100 is joined to the external microelectronic element 150.

In a further embodiment, the dielectric element 61 may include a compliant dielectric sub-element facing the surface 40 of the rigid layer 34, where the compliant dielectric sub-element is formed from a plurality of adjacent layers of compliant dielectric material with conductive traces in between the adjacent layers, and has conductive vias extending through a thickness of the compliant dielectric layers, such as disclosed in U.S. patent application "SEMICONDUCTOR CHIP PACKAGE ASSEMBLY AND METHOD FOR MAKING SAME," Ser. No. 13/105,325 filed May 11, 2011, incorporated by reference herein.

Referring to FIG. 5, the assembly 100 further may include a rigid underfill 110 between the surface 104 of the chip 102 and surface 38 of the rigid layer 34 facing the chip. The rigid underfill 110 may be formed adhered to portions of the surface 38, exposed portions of the conductive portions 66 and exposed portions of the optional protective layer 68. In one embodiment, the rigid underfill 110 may overlie portions of the surface 38 of the rigid layer 34 adjacent to the chip 102. The rigid underfill 110 may have a Young's modulus of about 6 GPa or greater and include dielectric material.

In a further embodiment, a layer of encapsulant 114 may be provided covering portions of the substrate, and portions of the chip and the underfill, to protect the encapsulated components from the external environment. The encapsulant 114 may include dielectric material, and may or may not be molded, such as shown in FIG. 5.

In another embodiment, underfill and a layer of encapsulant may be made of the same material, such as a dielectric material, and applied at the same time, such as part of a molding process.

In accordance with the present invention, the structural and material characteristics of the substrate contacts, the terminals and a dielectric element, which includes a rigid layer adjacent the substrate contacts and a compliant dielectric layer, may be adapted to permit displacement of the terminals of the substrate relative to the substrate contacts, and provide that the displacement appreciably relieves mechanical stresses, such as may be caused by differential thermal expansion or contraction, which would be present in electrical connections between the terminals and an external component to which the terminals are bonded. In particular, the structural and material characteristics of the substrate contacts, the dielectric element and the terminals may be adapted to permit more movement of the terminals relative to the substrate contacts, in comparison to the amount of relative movement that would be permitted absent the combination of the dielectric element between the substrate contacts and the terminals. In this way, the movability of the terminals under applied loads may appreciably reduce mechanical stresses in the electrical connections between the terminals and the external component.

As used in the claims with respect to contacts of a substrate joined to a microelectronic element in a microelectronic assembly, the term "movable" means that when the assembly is exposed to external loads, such as may occur as a result of thermal excursions during fabrication, testing or operation of the inventive assembly, the terminals are capable of being displaced relative to the substrate contacts by the external loads applied to the terminals, based on the compliancy of the dielectric element, to the extent that the displacement appreciably relieves mechanical stresses, such as those caused by differential thermal expansion which would be present in the electrical connections of the terminals with an external component to which the terminals are bonded.

Referring to FIG. 5, in the completed assembly 100, the solder masses 72, which may be bonded to the conductive regions 70 that serve as terminals of the substrate 10, and the conductive regions 70 serving as the terminals, desirably can move or tilt slightly with respect to the contacts 66A of the inner conductive layer 20, based on the compliancy of the dielectric element 61 between the conductive layers 20 and 28. The dielectric element 61 can flex or otherwise deform to accommodate movement of the terminals 70 relative to the contacts 66A bonded to the chip, when the terminals 70 are attached to an external component, as may be caused, for example, by differential thermal expansion and contraction of the elements during operation, during manufacture as, for example, during a solder bonding process, or during testing.

In one embodiment, a solder resist layer 80 may overlie portions of the surface 16 of the compliant dielectric layer 12 except for locations at which the terminals 70 are formed.

In another embodiment, the terminals 70 may be adapted to simultaneously carry different electrical signals or electrical potentials, and be bonded to an external component 150 similarly as in FIG. 5.

In a further embodiment (FIG. 6), a microelectronic assembly 200 has features similar to that shown in FIG. 5, except that the conductive portions 70 are shaped in the form of posts, the posts serving as terminals of the substrate to which an external chip may be connected. In one embodiment, the terminals 70 may have a thickness of about 50-300 μm. In the particular embodiment depicted, the terminals 70 have horizontal dimensions (in directions parallel to surfaces of the dielectric element 61) at a surface adjacent the compliant dielectric layer 12 greater than the horizontal dimensions at a surface remote from the dielectric layer 12, such that the horizontal dimensions of the terminal 70 decrease in the direction away from the layer 12 so as to be in the form of a post, which desirably is a substantially rigid solid metal post. In such embodiment, the conductive portions 70 are aligned with the conductive vias 48, which electrically connect the conductive portions 70 that serve as the terminals of the substrate with the conductive portions 66, through the traces 62 and the conductive vias 42.

In some embodiments, one or more solder masses 72 may be formed on the exposed surfaces of the terminals 70 of the assembly 200.

Figure 7:
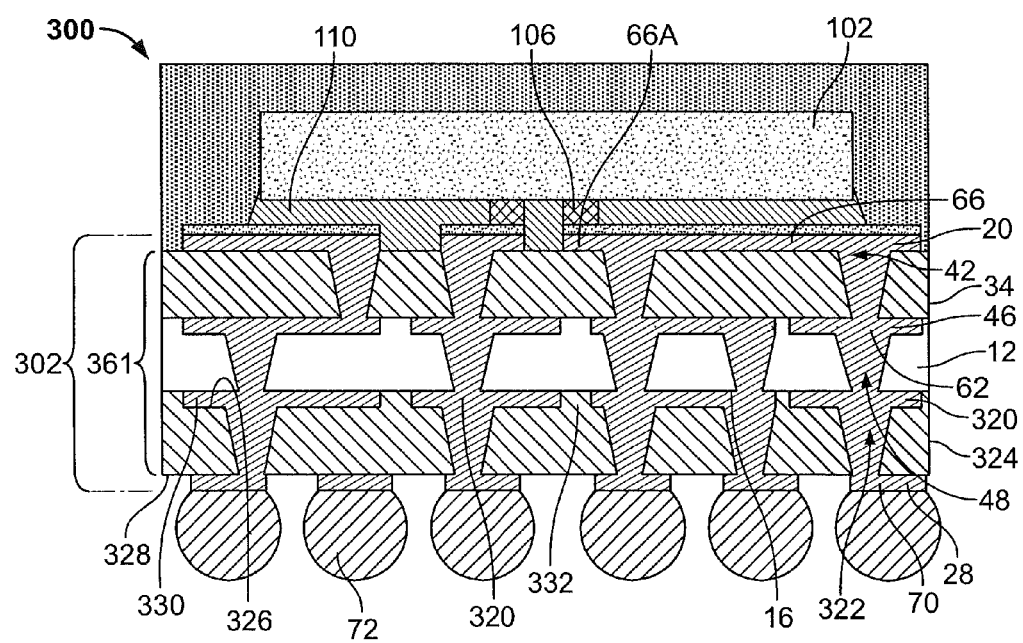
FIG. 7 is a diagrammatic sectional view of a microelectronic assembly, in accordance with yet another embodiment of the invention.

In a further embodiment, referring to FIG. 7, a microelectronic assembly 300 may include the chip 102 electrically connected with a substrate 302, which is fabricated and has features similar to the substrate of the assembly 100 of FIG. 5. Like reference numerals are used in this embodiment to designate the same or similar components as previously discussed. In this case, the substrate 302 can be similar to the substrate 10 described above relative to FIG. 5, except that the structure of a dielectric element 361 includes the rigid layer 34 adjacent the substrate contacts, the compliant dielectric layer 12 and an additional rigid layer 324 having top and bottom surfaces 326, 328, where the layer 12 is between the layers 34 and 324. In this embodiment, additional conductive traces 320 may be disposed between the top surface 326 of the rigid layer 324 and the bottom surface 16 of the compliant dielectric layer 12 and extend in a lateral direction parallel to the surfaces 324 and 16. Further, additional conductive vias 322 may extend through holes in the rigid layer 324 and electrically connect the traces 320 with the terminals 70. The traces 320 may electrically connect the vias 48 with the vias 322, such that the terminals 70 are electrically connected with the contacts 66A through a conductive structure including the vias 322, the traces 320, the vias 48, the traces 62 and the vias 42. In this embodiment, fabrication may be performed to laminate the conductive layer 330 to the surface 16 of the compliant dielectric layer 12 or the top surface 326 of the rigid layer 324, so that projections 332 of dielectric material of the dielectric material of the rigid layer 324 extend from the surface 326 upwardly through openings between the conductive portions 320 of the layer 330. In addition, in this embodiment, the conductive layer 28 may be laminated to the bottom surface 328 of the layer 324 during fabrication. Further, the rigid layer 324 may be patterned with holes that contain the vias 322 in a pattern corresponding to the holes of the compliant dielectric layer 12, such that the vias 48 and 322 are vertically aligned and the vias 48 and 322 extend from the traces 320. Thus, in this embodiment the terminals 70 are electrically connected with the contacts 66 through the vias 322, the traces 320, the vias 48, the traces 62 and the vias 42, such that the terminals 70 may bend slightly due to the compliancy of the dielectric element 361, to accommodate movement relative to the contacts 66A connected to the chip 102 that may be caused by differential thermal expansion and contraction.

Figure 6:
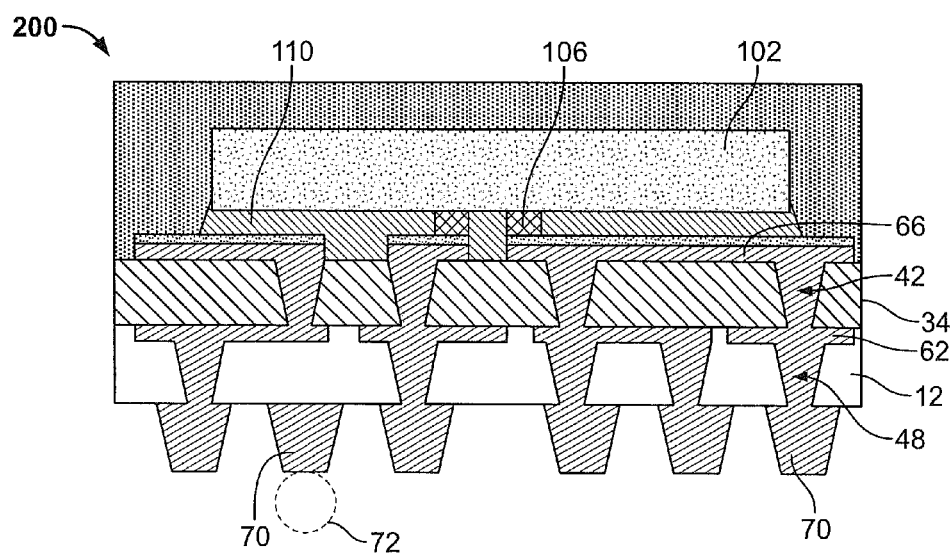
FIG. 6 is a diagrammatic sectional view of a microelectronic assembly, in accordance with another embodiment of the invention.

In a further embodiment (FIG. 8), a microelectronic assembly 400 has features similar to that shown in FIG. 7, except that the terminals are conductive portions 70 at the surface 328 of the rigid layer 324 which are in the shape of posts, similarly as in the assembly 200 shown in FIG. 6.

Figure 8:
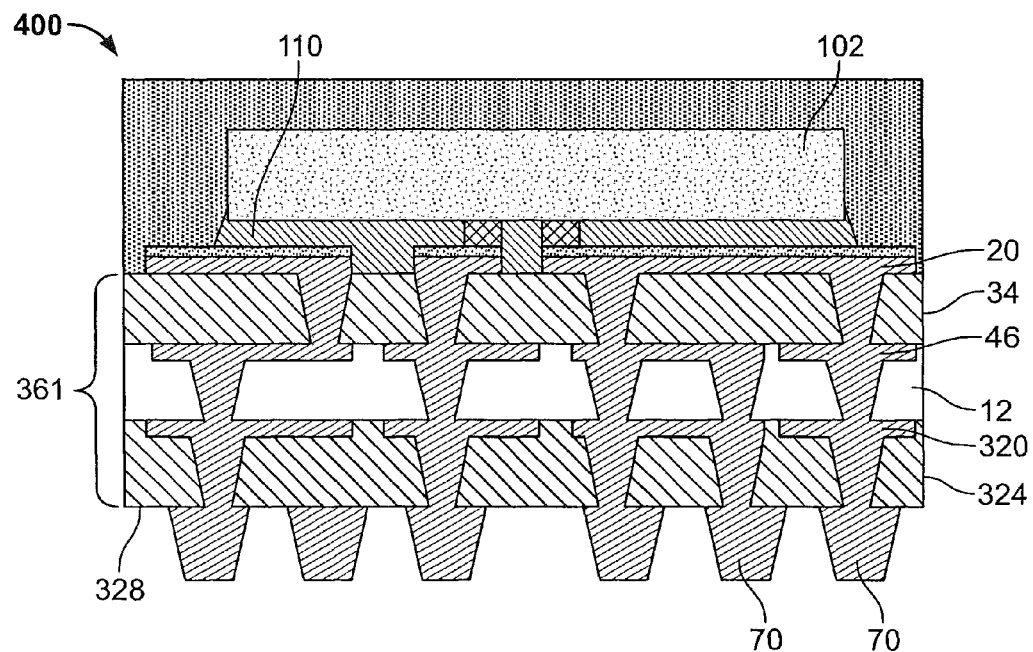
FIG. 8 is a diagrammatic sectional view of a microelectronic assembly, in accordance with yet another embodiment of the invention.

In some embodiments, the assemblies of FIGS. 7-8 may include a solder resist layer overlying the surface 328 of the rigid layer 324, such as described above with reference to FIG. 5.

Figure 10A:
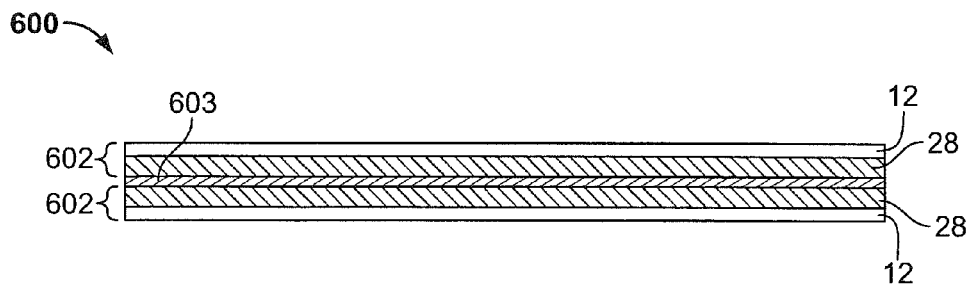
FIGS. 10(a)-10(j) are diagrammatic sectional views illustrating stages in a method of fabricating a microelectronic assembly, in accordance with one embodiment of the invention.
Figure 10B:
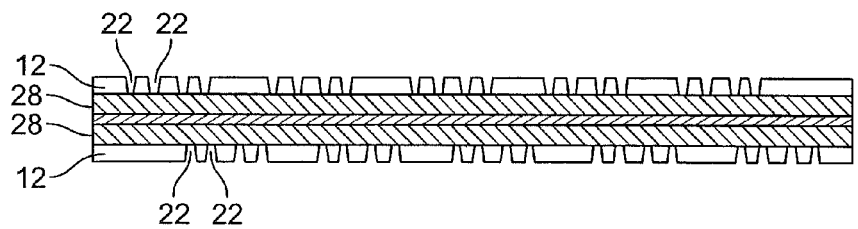
Figure 10C:
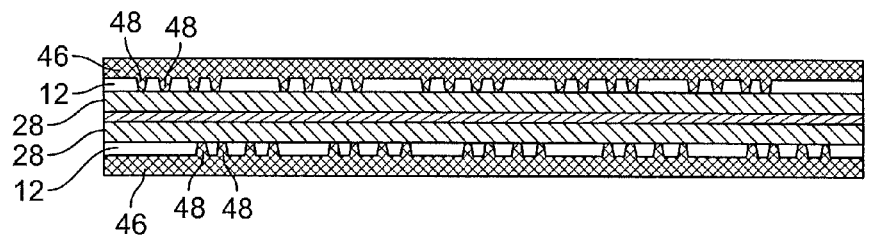
Figure 10D:
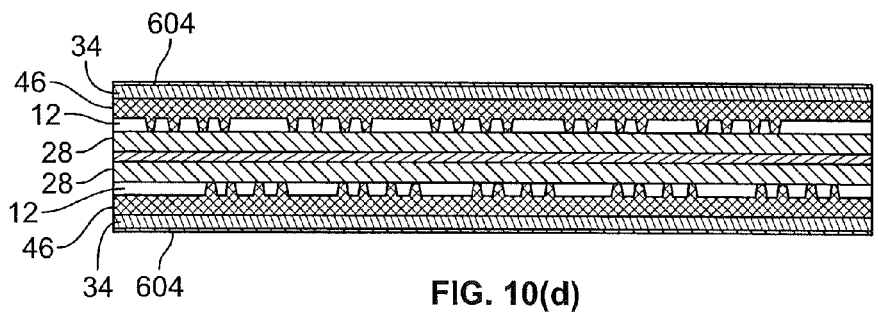
Figure 10E:
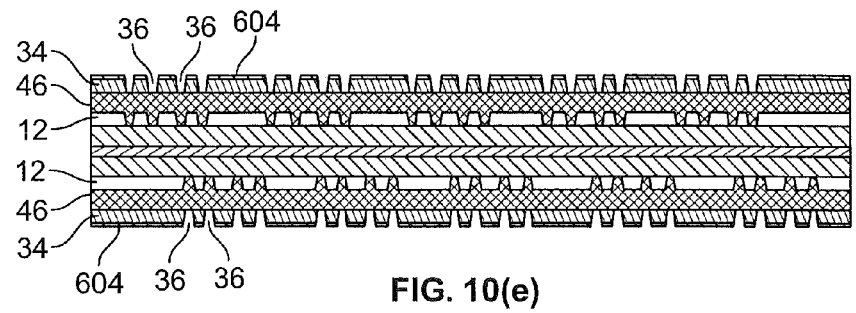
Figure 10F:
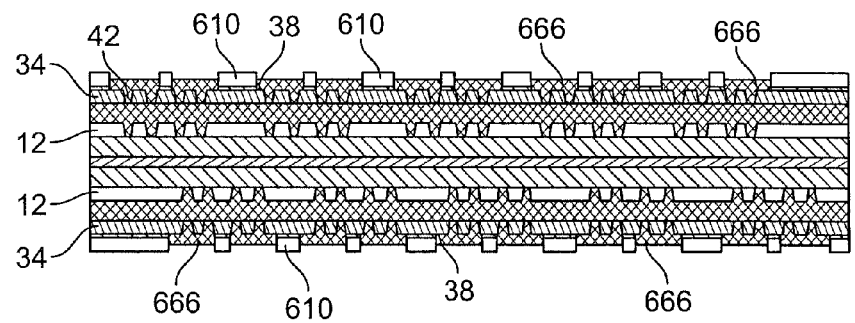
Figure 10G:
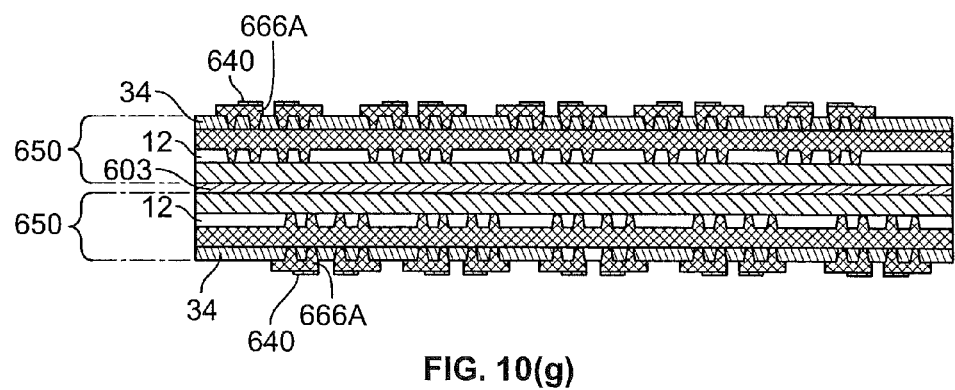
Figure 10H:
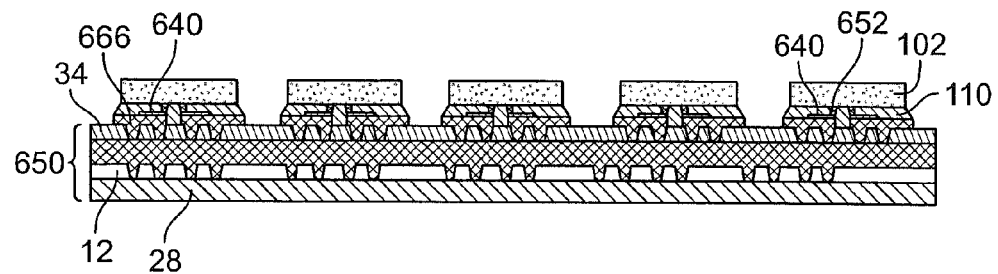

FIGS. 10(a)-10(j) illustrate a method of fabricating a microelectronic assembly 600, in accordance with another embodiment of the invention. Referring to FIG. 10(a), laminates 602 may be attached back-to-back by a peelable tape 603, where each of the laminates may include a compliant dielectric layer 12 laminated to a conductive element 28, such as a continuous layer of metal, which serves as a carrier of the layer 28. Referring to FIG. 10(b), holes 22 may be formed in the compliant dielectric layers 12, such as by laser scribing. Referring to FIG. 10(c), conductive material may be deposited, or a conductive paste may be printed, over the layers 12 to form the conductive vias 48 in the holes 22 and a conductive layer 46 over the compliant dielectric layers 12. Referring to FIG. 10(d), rigid dielectric layers 34 may be formed on the exposed surface of the conductive layers 46, and a layer of conductive material 604 may be formed at a surface of the layers 34 remote from the surface of the layers 34 adjacent to the conductive layer 46. The layers 604 may include copper and, in one example, may have a thickness under 5 μm. Referring to FIG. 10(e), holes 36 may be formed in the rigid layers 34 by laser scribing. Referring to FIG. 10(f), a resist or solder mask 610 may be formed on portions of the conductive layers 604 by photolithography. Conductive material, such as copper, may be applied by a plating process to form the conductive vias 42 in the holes 36, and conductive portions 666. The conductive portions 666 contain conductive material of the layer 604 (not shown in FIG. 10(f)), and include contacts and traces extending along the surfaces 38 of the layers 34 from the contacts. The solder mask 610 may be removed, and then flash etching may be performed to remove portions of the layer 604 which had been covered by the removed solder mask 610, and portions of the top surface of the conductive portions 666. Referring to FIG. 10(g), conductive material portions or pads 640 may be formed over contacts 666A by electrolytic plating of conductive material, such as tin. The resulting substrates 650 may then be separated from the peelable tape 803, and referring to FIG. 10(h), the substrate 650 may be joined to microelectronic elements 102 by masses of a conductive material such as a bond metal, e.g., solder, tin or indium or a conductive paste 652, which electrically interconnects and bonds contacts (not shown) of the elements 102 with the pads 640. In addition, an underfill 110 may be applied between each of the elements 102 and the substrate 650.

Figure 10I:
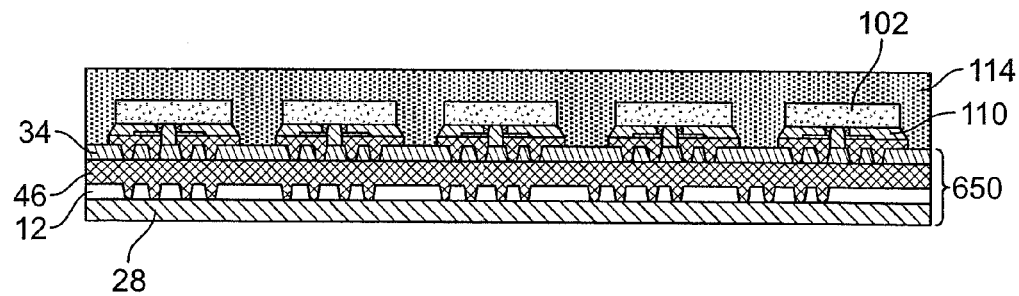

An encapsulant 114 may then be applied to cover portions of the substrate, the chips and underfill, such as by molding, as shown in FIG. 10(i). In a particular embodiment, the underfill 110 and the encapsulant 114 can be applied at the same time to the assembled structure of the microelectronic elements and the substrate and may be the same material.

In yet another variation, an underfill of the "no flow" type may be applied to the substrate 650 or to the microelectronic elements prior to joining the substrate with the microelectronic elements, and then such no flow underfill can be cured after the joining step. The encapsulant 114 then is a different material applied after the microelectronic elements 102 are assembled with the substrate 650.

Figure 10J:
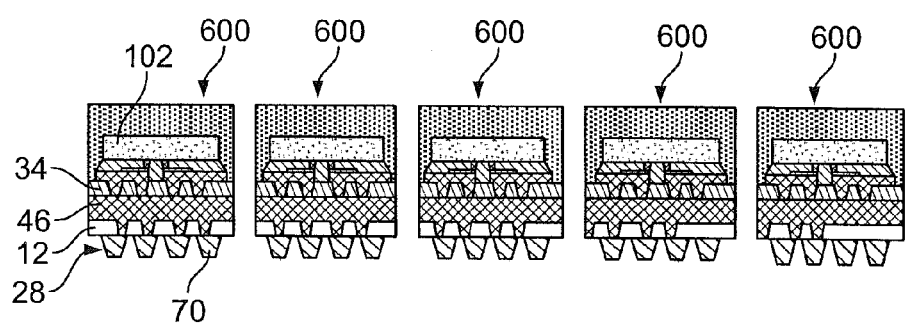

Referring to FIG. 10(j), the substrate 650 covered by the encapsulant may then be severed to obtain discrete microelectronic assemblies 600 each containing a microelectronic element 102, and the conductive layer 28 may be etched to form conductive portions 70, which serve as terminals, such as posts as shown in FIG. 6, or alternatively pads, of each of the discrete microelectronic assemblies 600.

Figure 11A:
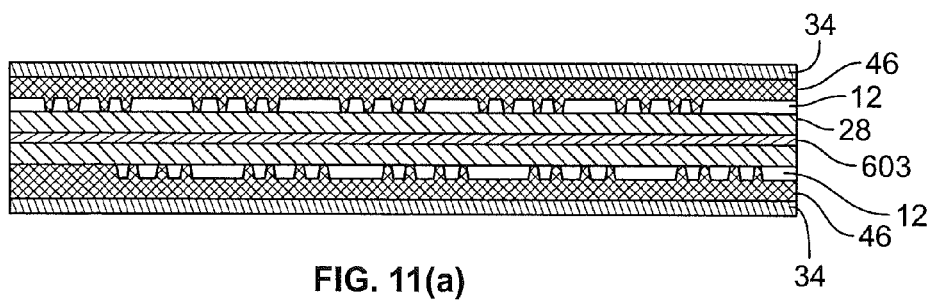
FIGS. 11(a)-11(c) are diagrammatic sectional views illustrating stages in a method of fabricating a substrate, in accordance with one embodiment of the invention.
Figure 11B:
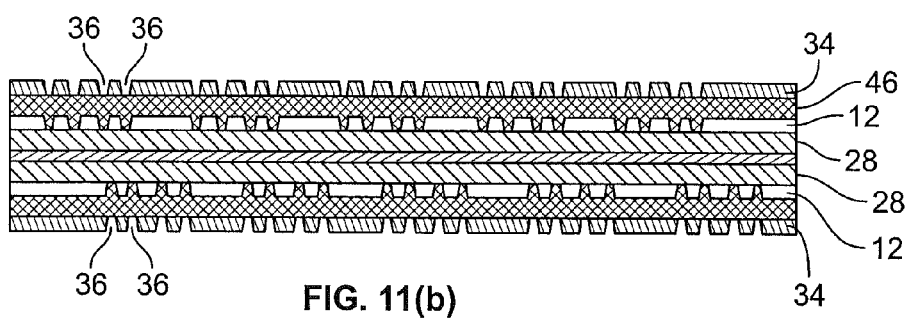
Figure 11C:
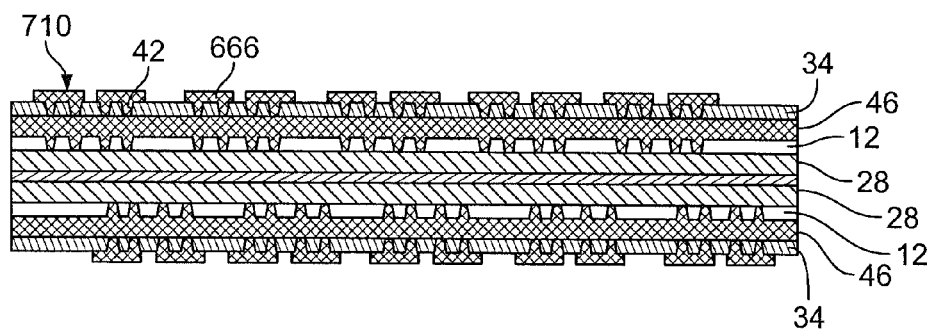

In a further embodiment, referring to FIGS. 11(a)-11(c), the substrate structure formed as described above in connection with FIGS. 10(a)-10(d), except for the layer 604, may be provided, and holes 36 may be formed in the rigid layers 34 by laser scribing. A conductive paste 710 may then be printed selectively, using a stencil, into the holes 36 to form the conductive vias 42, and onto uncovered portions of the rigid layers 34 to form the conductive portions 666. The processing may then be performed similarly as described in connection with FIGS. 10(g)-10(j), to obtain discrete microelectronic assemblies.

Figure 9:
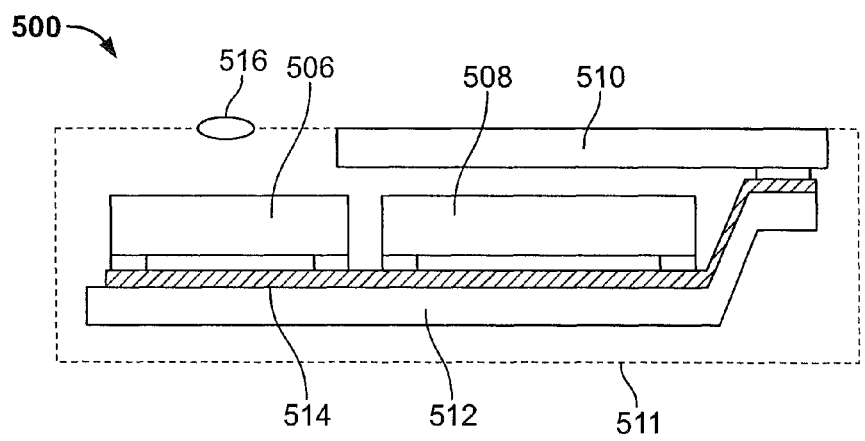
FIG. 9 is a schematic depiction of a system according to one embodiment of the invention.

The microelectronic assemblies described above can be utilized in construction of diverse electronic systems, as shown in FIG. 9. For example, a system 500 in accordance with a further embodiment of the invention includes a microelectronic assembly 506 as described above in conjunction with other electronic components 508 and 510. In the example depicted, component 508 is a semiconductor chip whereas component 510 is a display screen, but any other components can be used. Of course, although only two additional components are depicted in FIG. 9 for clarity of illustration, the system may include any number of such components. The microelectronic assembly 506 may be any of the assemblies described above. In a further variant, any number of such microelectronic assemblies may be used. Microelectronic assembly 506 and components 508 and 510 are mounted in a common housing 511, schematically depicted in broken lines, and are electrically interconnected with one another as necessary to form the desired circuit. In the exemplary system shown, the system includes a circuit panel 512 such as a flexible printed circuit board, and the circuit panel includes numerous conductors 514, of which only one is depicted in FIG. 9, interconnecting the components with one another. However, this is merely exemplary; any suitable structure for making electrical connections can be used. The housing 511 is depicted as a portable housing of the type usable, for example, in a cellular telephone or personal digital assistant, and screen 510 is exposed at the surface of the housing. Where structure 506 includes a light sensitive element such as an imaging chip, a lens 516 or other optical device also may be provided for routing light to the structure. Again, the simplified system shown in FIG. 9 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention.

What is claimed is:

1. A microelectronic assembly comprising:
   a substrate including
   a dielectric element having first and second opposed surfaces, a first dielectric layer having a first material structure adjacent the first surface, and a second dielectric layer having a second material structure different from the first material structure, the second dielectric layer disposed between the first dielectric layer and the second surface, wherein the first material structure as the first dielectric layer has a first Young's modulus at least 50% greater than a second Young's modulus of the second material structure as the second dielectric layer, the second Young's modulus being less than two gigapascal (GPa);

a plurality of substrate contacts at the first surface, a plurality of terminals at the second surface; and a conductive structure extending through the first and second dielectric layers and electrically connecting the substrate contacts with the terminals;

a microelectronic element having a face confronting the first surface and a plurality of element contacts thereon joined with the substrate contacts through conductive masses; and a rigid underfill between the face of the microelectronic element and the first surface, wherein the terminals are configured and usable for bonding the microelectronic assembly to corresponding contacts of a component external to the microelectronic assembly, and wherein the second Young's modulus of the second material structure has a value selected in relation to the first Young's modulus of the first material structure and the terminals have a material structure that permits a predetermined displacement by bending such that, when the terminals are bonded through electrical connections to the corresponding contacts of the external component, the terminals move up to the predetermined displacement by bending relative to the substrate contacts, when an external load is applied to the terminals through the electrical connections between the terminals and the contacts of the external component, to appreciably reduce mechanical stresses in the electrical connections between the terminals and the contacts of the external component, as caused by differential thermal expansion or contraction, which would be present in the electrical connections between the terminals and the contacts of the external component absent said predetermined displacement.

2. The microelectronic assembly of claim 1 further comprising:

a solder mask at least one of the first surface or the second surface.

3. The microelectronic assembly of claim 1 further comprising: solder masses joined to the terminals.

4. The microelectronic assembly of claim 1, wherein the terminals include first and second substantially rigid solid metal posts adapted to simultaneously carry respective first and second electrical signal potentials, the first and second potentials being different.

5. The microelectronic assembly of claim 1, wherein the material structure of the terminals are portions of a conductive layer at the second surface of the dielectric element.

6. The microelectronic assembly of claim 1, wherein the first Young's modulus is at least two gigapascal (GPa).

7. The microelectronic assembly of claim 1, wherein at least one of the terminals is a substantially rigid solid metal post.

8. The microelectronic assembly of claim 7 further comprising: solder joined to the at least one metal post.

9. The microelectronic assembly of claim 1 further comprising:

bonding material between the terminals and the external component joining the terminals to the external component.

10. The microelectronic assembly of claim 9, wherein the bonding material is solder and the external component is a circuit panel.

11. The microelectronic assembly of claim 1, wherein the first and second Young's moduli are less than two GPa.

12. The microelectronic assembly of claim 11, wherein the dielectric element includes a third dielectric layer, wherein all dielectric layers of the substrate including each of the first, second and third dielectric layers have a Young's modulus less than two GPa.

13. The microelectronic assembly of claim 1, wherein the microelectronic element is a chip having conductive bumps as the element contacts.

14. The microelectronic assembly of claim 13, wherein the terminals are portions of a conductive layer.

15. A system comprising an assembly according to claim 1 and one or more other electronic components electrically connected to the assembly.

16. The system of claim 15, wherein the terminals are electrically connected to a circuit panel.

17. The system as claimed in claim 15, further comprising a housing, the assembly and the other electronic components being mounted to the housing.

18. The microelectronic assembly of claim 1, wherein the conductive structure includes conductive traces extending parallel to at least one of the first surface or the second surface.

19. The microelectronic assembly of claim 18, wherein the conductive traces include traces extending along at least one of the first surface or the second surface.

20. The microelectronic assembly of claim 18, wherein the conductive traces include traces disposed between the first surface and the second surface.

21. The microelectronic assembly of claim 20, wherein the conductive traces include traces extending along a boundary between the first dielectric layer and the second dielectric layer.

22. The microelectronic assembly of claim 18, wherein the conductive structure includes conductive vias extending through the first and second dielectric layers, at least some of the vias extending from the traces.

23. The microelectronic assembly of claim 1, wherein the dielectric element includes a third dielectric layer disposed between the second surface and the second dielectric layer, the third dielectric layer having a third material structure different from the second material structure, the third dielectric layer having a Young's modulus at least 50% greater than the Young's modulus of the second dielectric layer, and wherein the conductive structure extends through the third dielectric layer.

24. The microelectronic assembly of claim 23, wherein all dielectric layers of the substrate including each of the first, second and third dielectric layers have a Young's modulus less than 2 GPa.

25. The microelectronic assembly of claim 23 further comprising: solder masses joined to the terminals.

26. The microelectronic assembly of claim 23 further comprising:

a solder mask at least one of the first surface or the second surface.

27. The microelectronic assembly of claim 23, wherein the terminals include first and second substantially rigid solid metal posts adapted to simultaneously carry respective first and second electrical signal potentials, the first and second potentials being different.

28. The microelectronic assembly of claim 23, wherein the terminals are portions of a conductive layer at the second surface of the dielectric element.

29. The microelectronic assembly of claim 23, wherein the first dielectric layer has a Young's modulus of at least about two GPa.

30. The microelectronic assembly of claim 23, wherein at least one of the terminals is a substantially rigid solid metal post.

31. The microelectronic assembly of claim 30 further comprising: solder joined to the at least one metal post.

32. The microelectronic assembly of claim 23 further comprising:
bonding material between the terminals and the external component joining the terminals to the external component.

33. The microelectronic assembly of claim 32, wherein the bonding material is solder and the external component is a circuit panel.

34. The microelectronic assembly of claim 23, wherein the conductive structure includes conductive traces extending parallel to at least one of the first surface or the second surface.

35. The microelectronic assembly of claim 34, wherein the conductive traces include traces extending along at least one of the first surface or the second surface.

36. The microelectronic assembly of claim 34, wherein the conductive structure includes conductive vias extending through the first, second and third dielectric layers, at least some of the vias extending from the traces.

37. The microelectronic assembly of claim 34, wherein the conductive traces include traces disposed between the first surface and the second surface.

38. The microelectronic assembly of claim 37, wherein the conductive traces include traces extending along at least one of a boundary between the first dielectric layer and the second dielectric layer or a boundary between the second dielectric layer and the third dielectric layer.

39. An interconnection substrate comprising:
a dielectric element having first and second opposed surfaces, a first dielectric layer having a first material structure adjacent the first surface and a second dielectric layer having a second material structure different from the first material structure, the second dielectric layer disposed between the first dielectric layer and the second surface, wherein a the first material structure as the first dielectric layer has a first Young's modulus at least 50% greater than a second Young's modulus of the second material structure second dielectric layer, the second Young's modulus being less than two gigapascal (GPa);
a plurality of substrate contacts at the first surface for joining with element contacts exposed at a face of microelectronic element confronting the first surface, at least a portion of the substrate contacts matching a pattern of the element contacts exposed at the face of the microelectronic element;
a plurality of terminals at the second surface for joining with respective contacts of a component external to the substrate; and
a conductive structure extending through the first and second dielectric layers and electrically connecting the substrate contacts to the terminals,
wherein the second Young's modulus of the second material structure has a value selected in relation to the first Young's modulus of the first material structure and the terminals have a material structure that permits a predetermined displacement by bending such that, when the terminals are bonded through electrical connections to the corresponding contacts of the external component, the terminals move up to the predetermined displacement by bending relative to the substrate contacts, when an external load is applied to the terminals through the electrical connections between the terminals and the contacts of the external component, to appreciably reduce mechanical stresses in the electrical connections between the terminals and the contacts of the external component, as caused by differential thermal expansion or contraction, which would be present in the electrical connections between the terminals and the contacts of the external component absent said predetermined displacement.

40. The substrate of claim 39 further comprising:
a solder mask at least one of the first surface or the second surface.

* * * * *